April 28, 1970 J. M. SCHROEDER 3,509,433
CONTACTS FOR BURIED LAYER IN A DIELECTRICALLY ISOLATED SEMICONDUCTOR POCKET
Filed May 1, 1967 2 Sheets-Sheet 1

INVENTOR.
JON SCHROEDER
BY Roger S. Borovoy
Norman M. Kurtz
ATTORNEYS

INVENTOR.
JON SCHROEDER
BY Roger S. Borovoy
Norman N. Kunitz
ATTORNEYS

United States Patent Office 3,509,433
Patented Apr. 28, 1970

3,509,433
CONTACTS FOR BURIED LAYER IN A DIELECTRICALLY ISOLATED SEMICONDUCTOR POCKET

Jon M. Schroeder, Los Altos, Calif., assignor to Fairchild Camera and Instrument Corporation, Syosset, N.Y., a corporation of Delaware Filed May 1, 1967, Ser. No. 635,144
Int. Cl. H01l 19/00
U.S. Cl. 317—234 6 Claims

ABSTRACT OF THE DISCLOSURE

Describes a structure for and method of making ohmic contact to a buried, highly conductive layer in a dielectrically isolated semiconductor pocket in order to eliminate potential failure modes and reduce signal-path resistance in the lower region of the pocket. Essentially, a raised area is formed adjacent to but separated from a side of the semiconductor pocket, the raised area comprising a portion of the buried, highly conductive layer to which contact is made from the pocket upper surface. The invention is particularly suitable for fabricating composite semiconductor devices, such as integrated circuits or arrays, in which complex integrated arrays of semiconductor elements are electrically isolated from each other and all are formed within a single unitary structure.

This invention relates to a composite semiconductor device, such as an integrated circuit or array, having dielectrically isolated pockets of semiconductor material. In particular, this invention relates to a structure for and method of making ohmic contact to a buried, highly conductive layer in a dielectrically isolated semiconductor pocket.

The semiconductor art has evolved the dielectrically isolated semiconductor pocket as a means of fabricating complex integrated arrays of semiconductor elements electrically isolated one from the other and all within a single unitary structure. In general, the method of fabrication comprises treating one major surface of a semiconductor slice so as to produce a network of grooves conforming to the desired isolation pattern between semiconductor elements of the circuit to be fabricated. This network may be produced by such techniques as etching, using an etch-resistant mask produced by photoresist processes. A dielectric layer, for example of a silicon oxide, then is deposited on the ground surface to provide a thin but complete layer thereon. To the dielectric surface a backing is applied for mechanical support using one of several alternative schemes. For example, a pyrolytic deposition of polycrystalline silicon is preferred because the thermal expansion properties are similar to monocrystalline silicon. The slice is then reversed and a portion of the semiconductor material is removed from the opposite major surface by etching or mechanical polishing to a depth sufficient, at least, to reach the bottom of the grooves, thereby producing an array of isolated semiconductor pockets. These pockets then are treated using standard techniques including epitaxial deposition or solid state diffusion or both to fabricate the elements of the integrated circuit. Interconnections are conveniently made between these elements by metal-film evaporation.

The semiconductor pockets provide a high degree of electrical isolation by incorporating a silicon oxide or comparable dielectric barrier between elements, which at the same time yields a structure upon which metal films may be deposited, thereby affording great facility and improved reliability for the interconnections of the integrated circuit. Many of the disadvantages of prior art methods are thus eliminated. Further discussions of the dielectrically isolated semiconductor pocket and methods of making it may be found in the literature, as for example, in the Proceedings of the National Electronic Conference, October 1964, pages 175–179, and in the Proceedings of the Fourth Annual Microelectronic Symposium, IEEE, May 1965, pages 4D1–9. Reference should also be made to U.S. patent application Ser. No. 443,461, filed Mar. 29, 1965 now Patent No. 3,391,023. and assigned to the same assignee as this invention.

One problem in the fabrication and use of composite semiconductor devices having dielectrically isolated semiconductor pockets, especially when one or more of the pockets contain a double-diffused transistor for high-frequency application, is the high series resistance resulting from the long signal path through the lower region of the pocket. Note that with the discrete semiconductor device, connection to the lower region is usually made at the bottom surface thereof, and the signal path across this region is relatively short. (It should be mentioned that with discrete epitaxial transistors, a highly conductive layer is often formed under the lower region, resulting in a longer signal path to the contact at the bottom surface of the device. However, the effective signal-path length is not changed substantially, but the resistance is reduced in the lower region.) With a composite semiconductor device, on the other hand, it is impossible or impractical to make contact to the lower region of the individual semiconductor pocket at the bottom surface; however, a portion of the lower region usually extends to the upper surface of the pocket, enabling contact to be made to this extended portion. Nevertheless, because a semiconductor pocket is approximately five to ten times as wide as it is deep, the signal path through the lower region to the contact at the pocket upper surface is approximately five times longer than the signal path through the lower region of an individual discrete device, increasing the signal path resistance by approximately five times or more. Such a higher signal path resistance in the lower region of the dielectrically isolated pocket (that is, the collector region of a transistor) results in undesirable operating characteristics compared to those of single discrete transistors, particularly for high-frequency applications and for use in monolithic amplifiers.

In order to solve this problem, a highly conductive layer of metal or semiconductor material is usually formed along the bottom of the pocket, thus providing a low resistance signal path to which contact from the pocket upper surface can be made. Because of the length-to-depth relationship of the pockets, as mentioned above, the resistance of the signal path by this technique can be reduced by at least a factor of five.

Prior to this invention, it has been difficult to make satisfacory contact to the highly conductive underlayer. For example, one method of making contact is to diffuse a dopant down through the lower semiconductor region from the pocket surface to a depth sufficient to make ohmic contact with the highly conductive underlayer. However, to make such a deep diffusion, the device must be kept at a high temperature and for a relatively long time period. The process is difficult to control because of the danger that other semiconductor regions within the pocket might diffuse into each other, causing shorts. It should be noted that although the highly conductive underlayer may comprise a semiconductor material or a metal, use of the former is generally preferred. This is due to the fact that a strip of metal placed underneath the lower region along the bottom of the pocket is difficult to process because extra evaporation steps are needed. Moreover, a P-N junction often forms at the interface of metal and the semiconductor material. Conversely, use of a semiconductor material as the highly conductive underlayer having material of the same conductivity type but with a substantially higher impurity concentration than the lower semiconductor region serves to simplify the processing steps.

In another commonly used prior art process, a portion of the highly conductive underlayer is formed along the sides of the pocket as well as the bottom, so that contact thereto is made by a relatively shallow diffusion of a dopant of high impurity concentration from the pocket surface. The latter method eliminates the need for high temperature diffusion over a long time period. Moreover, this diffusion can be made at the same time as one of the diffusions for an element. For example, in the case of a transistor, the contact diffusion is performed at the same time as the emitter diffusion.

On the other hand, several failure modes can occur with the latter process. In order to diffuse the contact region, a portion of the overlying protective layer along the surface and near or over the edge of the pocket must be cut away. (A typical diffusion method for semiconductor devices is described in U.S. Patent No. 3,025,589, dated Mar. 20, 1962 and assigned to the same same assignee as this invention.) Following diffusion, the protective overlayer is regrown over the portion cut away. It should be noted that whenever a protective layer, such as an oxide, is thinned or cut away and then regrown over polycrystalline silicon, the layer is of relatively poor quality because of the large number of small pinholes that develop, causing deterioration in the protective material. In addition, because of the small dimensions of each of the pockets, for example the highly conductive underlayer is about three microns wide, it is difficult to align the processing equipment so that only the protective layer directly above the surface portion of the highly conductive underlayer is cut away. A slight misalignment in one direction can result in the contact region being diffused into the center of the pocket, thus missing entirely the highly conductive underlayer; whereas a slight misalignment in the opposite direction can cause the contact region to be diffused into an adjacent pocket as well as into the desired pocket, thus forming a short between the two. Similarly, because the insulating material along the bottom and sides of the pocket is normally only three to twenty microns wide, and in some cases only one micron wide, a slight miscalculation during the lapping process can result in the insulating material being cut too thin, creating the danger of a short between an overlying metal contact and the support layer underneath. Thus, the combination of a low quality, regrown protective layer, a possible misalignment during the diffusing step, and a possible miscalculation during the lapping step greatly increases the probability of failure using the prior art process. Further, the thinner regrown oxide increases the capacitance of the pocket where metal patterns cross, another undesirable feature.

Briefly, the invented semiconductor device comprises a structure having a plurality of pockets of semiconductor material dielectrically isolated from each other by a layer of insulating material underlying the bottom and sides thereof. Each of the pockets comprise a first layer of monocrystalline semiconductor material of a first conductivity type and a highly conductive second layer extending along at least a portion of the bottom of the pocket. A raised area is formed along the bottom of at least one of the pockets and is adjacent to but separated from the side of the pocket, with a portion of the highly conductive underlayer lying within the raised area. A highly conductive contact region is formed within the first layer of the pocket and extends down from the upper surface thereof to a portion of the highly conductive underlayer located within the raised area, and makes ohmic contact therewith.

The invented process for making contact to the buried, highly conductive underlayer of a dielectrically isolated semiconductor pocket briefly comprises the steps of mesa etching one surface of a body of semiconductor material of a first conductivity type to form discrete areas of semiconductor material enclosed by an isolation groove surrounding each mesa. Next, or simultaneously, with the etching of isolation grooves, a contact groove is etched within at least one of the discrete areas, the contact groove being shallower than the isolation groove. A highly conductive layer is then formed along the plane surface of the mesa and, in at least said one discrete area, along the interior surface of the contact groove. Next, the plane surface of the mesa and the interior surface of the isolation groove and the contact groove are covered with an insulating material, after which a support layer is formed adjacent to the insulating material. A portion of the semiconductor material is then removed from the opposite surface at least up to the depth of the isolation groove to form the dielectrically isolated pocket. Contact to the buried, highly conductive underlayer is made by diffusing a highly conductive contact region from the opposite surface of at least one pocket containing the contact groove until ohmic contact is made to a portion of the highly conductive underlayer lying within the raised area. In this manner, the effective resistance of the signal path in the lower region of at least one dielectrically isolated pocket is greatly reduced.

The invented structure and process for making it represents an improvement over prior art structures or processes, because ohmic contact now may be made to the highly conductive underlayer from the top surface of the semiconductor pocket and away from the edge of the pocket itself, thus minimizing the inherent problems of a poor quality, regrown protective layer over polycrystalline silicon in combination with which a slight misalignment in one direction may cause no contact to occur, a slight misalignment in the other direction may cause a short to an adjacent pocket, and a slight miscalculation during lapping may cause a short to the underlying support layer.

The invention may be understood better from the following detailed description and the accompanying drawings in which.

Figure 1:
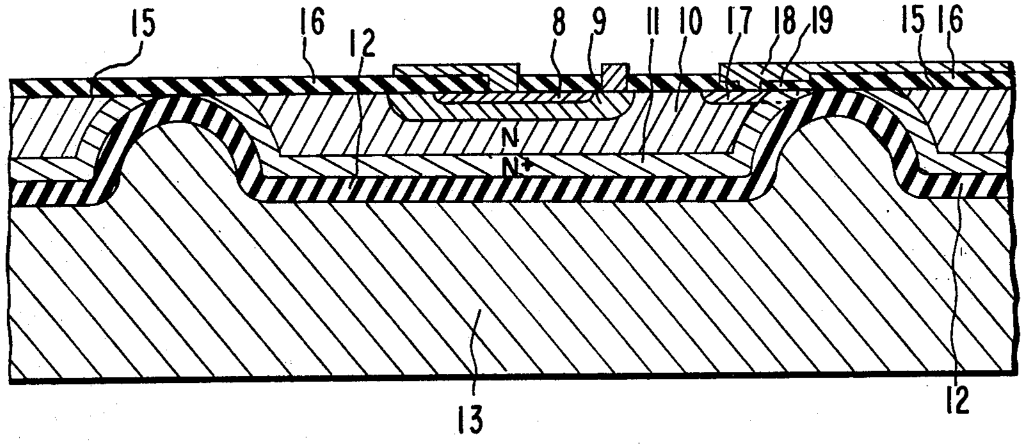
FIG. 1 PRIOR ART
FIG. 1 is a simplified cross-sectional view of a prior art device showing a dielectrically isolated semiconductor pocket in which contact is made to the highly conductive underlayer at the edge of the pocket via a highly conductive contact region extending from the surface of the pocket itself.

Referring to FIG. 1, a typical prior art structure of one pocket of a composite semiconductor device having a plurality of pockets of semiconductor material dielectrically isolated from each other is shown. The pocket comprises a layer of semiconductor material 10 of a first conductivity type, say N-type material. Underlying the semiconductor layer 10, and extending along at least a portion of the bottom of the pocket, is a layer of highly conductive material 11 having a thickness about 15 to 40 percent less than the thickness of the semiconductor layer 10. Layer 11 may, for example, comprise a metal; preferably through, layer 11 is of the same material and conductivity type as the semiconductor layer 10 but with a higher impurity concentration, say an N-plus type material. For example, if the surface concentration of the semiconductor layer 10 is $10^{14}$ to $10^{16}$ dopant atoms per cubic centimeter, the surface concentration of highly conductive underlayer 11 should be about $10^{18}$ dopant atoms per cubic centimeter. Underneath layer 11 is a layer of insulating material 12 which extends along the bottom and sides of the pocket. The insulating layer 12 is preferably silicon oxide, but any suitable material sufficient to ensure dielectric isolation between the pocket shown and other pockets within the semiconductor device may be used. Underneath the insulating layer 12 is a support layer 13, which is of a material that adheres to the insulating layer 12, can withstand the temperature used during further processing, and does not contain harmful particles which could contaminate the device during later processing. Polycrystalline silicon is usually used. In FIG. 1 the highly conductive underlayer 11 is shown extending from the bottom of the pocket up the sides thereof to the surface 15. Over the pocket upper surface 15, a layer 16 of protective material, preferably silicon oxide, is formed. A highly conductive contact region 17 extends from the upper surface 15 near the side of the pocket to make contact to the highly conductive underlayer 11. The highly conductive region 17 is of the same conductivity type as the semiconductor layer 10 but with a higher impurity concentration, and preferably has approximately the same high impurity concentration as the highly conductive underlayer 11. A metal contact 18, which makes ohmic contact to the highly conductive contact layer 17, is adherent to the protective layer 16, and may extend to other pockets in the device for making interconnecting thereto.

Figure 2:
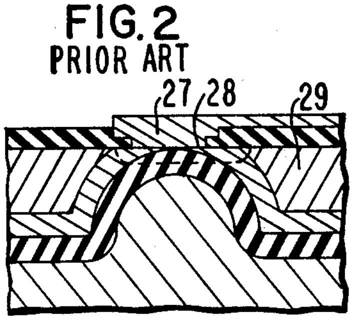
FIG. 2 PRIOR ART
FIG. 2 is a simplified cross-sectional view of a portion of a prior art device showing a possible failure mode resulting from misalignment of the contact region.

During processing, in order to diffuse the highly conductive contact region 17 so as to make contact to the highly conductive underlayer 11, a portion of the protective layer 16 is removed. Following diffusion, part of the cut away portion of layer 16 is regrown. However, compared to the original protective layer 16, the regrown oxide 19 is generally of a poor quality due in part to the large number of small pinholes that appear therein and in part to the fact that the regrown oxide 19 is only about one-third as thick as the original protective layer 16. Consequently, the surface directly under the thinner regrown oxide 19 is more susceptible to ambient contamination and to electrical breakdown. It should be noted that because the highly conductive layer 11 is normally only about three microns wide, a slight misalignment toward the center of the pocket during the step of removing a portion of the protective layer 16 may result in contact region 17 failing to make ohmic contact to the highly conductive underlayer 11. On the other hand, a slight misalignment away from the center of the pocket may result in the removal of a portion of the overlying protective layer 16 overlying the surface of an adjacent semiconductor pocket as well as from the surface of the desired pocket. Consequently, following diffusion and because of misalignment, a portion of the metal contact 27 extends over a portion of an adjacent pocket, as shown in FIG. 2. A short is likely to develop between the metal contact 27 and the adjacent pocket 29, due to the exposed surface 28.

Figure 3:
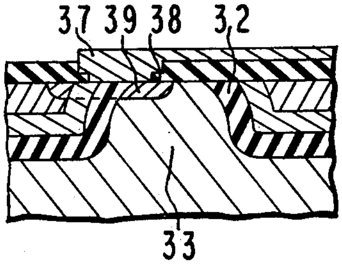
FIG. 3 PRIOR ART
FIG. 3 is a simplified cross-sectional view of a portion of a prior art device showing another possible failure mode resulting from a miscalculation during the semiconductor removal step.

Similarly, as shown in FIG. 3, because the width of the insulating layer 32 varies from approximately three to twenty microns and, in some cases, is only one micron wide, a slight miscalculation during the lapping step can result in a thinned or no insulating layer 32 at the surface of the pocket. A portion of the metal contact 37 overlies the thinned portion of the insulated layer 32, and at best is separated therefrom only by the regrown protective layer 38, which as mentioned previously is of poor quality; consequently, shorts are likely to develop from the metal contact 37 through the protective layer 38 or through contact region 39 to the underlying support layer 33.

It should be mentioned that as an example of a typical structure which can be formed within the pocket, FIG. 1 shows a double-diffused transistor comprising the semiconductor layer 10 (the collector), a region 9 located therein of opposite conductivity type (the base), and a separated region 8 of the first conductivity type located within region 9 (the emitter). Note also that because diffusion of the separated region 8 (emitter region) can be performed at the same time as the diffusion of the highly conductive region 17, the depth of one is approximately the same as the depth of the other.

Figure 4:
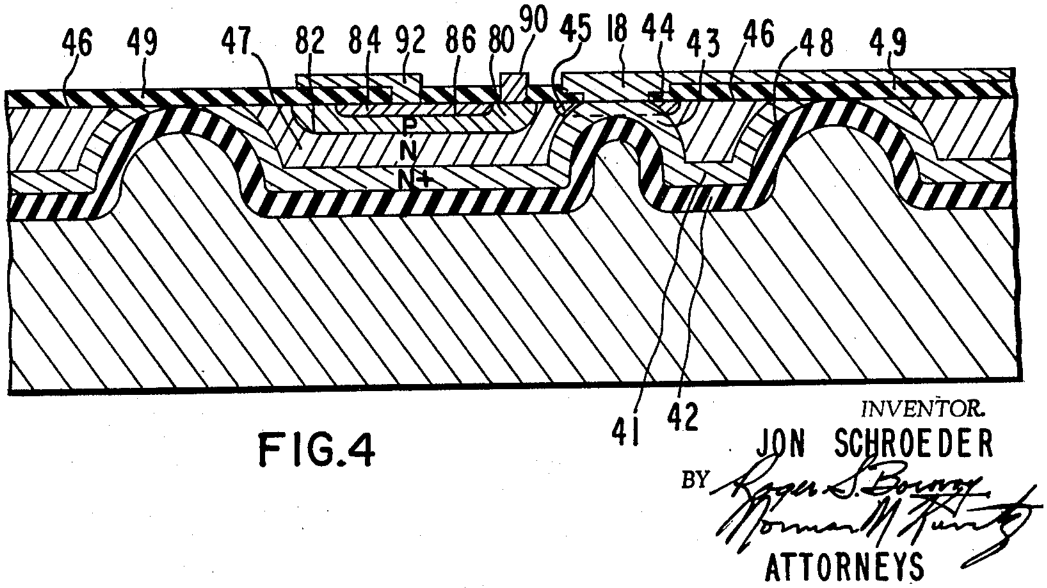
FIG. 4 is a simplified cross-sectional view of one pocket of the preferred embodiment of the invention showing contact to a raised portion of the highly conductive underlayer at a place separated from the edge of the pocket.
Figure 5A:
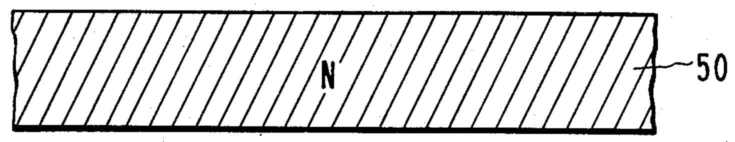
FIG. 5 shows a simplified cross-sectional view of a typical manufacturing process of one pocket in a composite semiconductor body with the improved method of the invention incorporated therein.
Figure 5B:
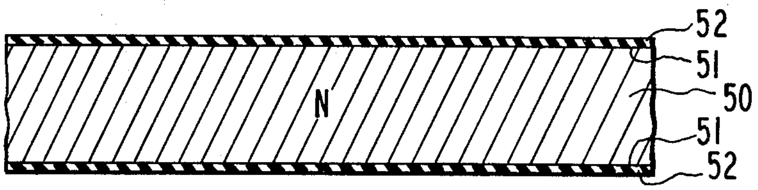
Figure 5C:
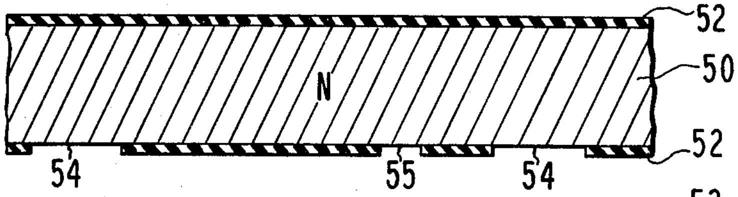
Figure 5D:
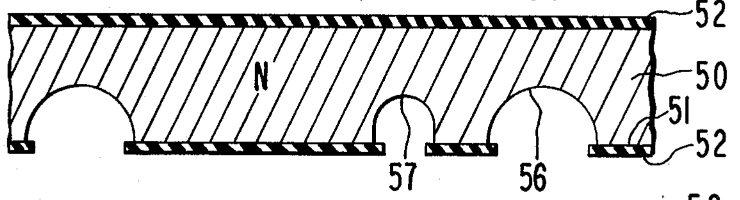
Figure 5E:
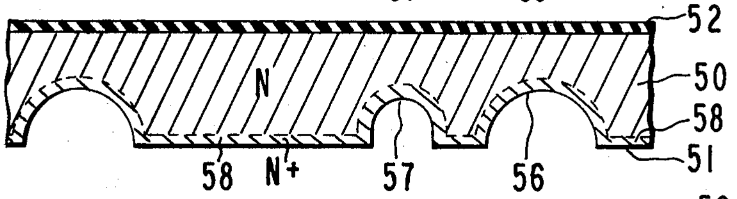
Figure 5F:
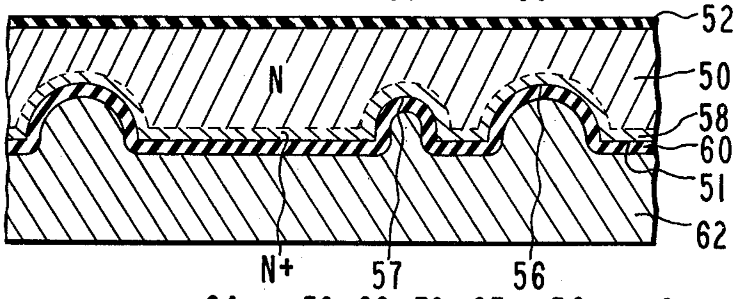
Figure 5G:
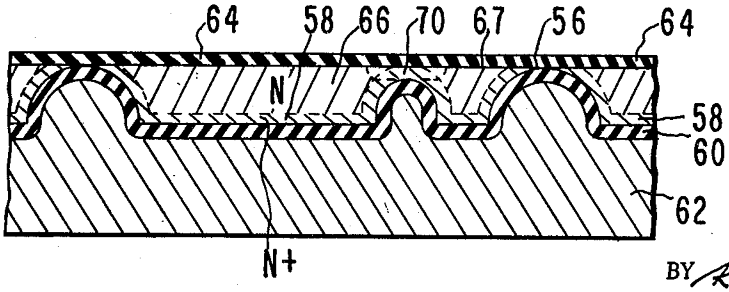

In the preferred embodiment of the invention, as shown in FIG. 4, the potential failure modes of the prior art structure of FIG. 1 are eliminated. The highly conductive underlayer 41 and the insulating underlayer 42 are altered so that a raised portion is formed which includes a portion 43 of the highly conductive layer 41. The raised portion 43 may extend to reach the surface 46. A highly conductive contact region 45 extends from the pocket surface 46 to make ohmic contact to the highly conductive raised portion 43. Contact region 45 is preferably of the same conductivity type as the semiconductor layer 47 but of a higher impurity concentration, that is, approximately of the same high concentration as the highly conductive layer 41. Note that both the highly conductive raised portion 43 and the highly conductive contact region 45 are adjacent to but separated from a side 48 of the pocket. During processing, when a portion of the overlying protective layer 49 is cut away in order to diffuse the highly conductive contact region 45, a slight misalignment on either side of the raised portion 43 may be made without the danger of the failure modes described for the prior art structure of FIG. 1 occurring. Thus, if any misalignment or miscalculation occurs, or any short, breakdown, or other detrimental effect because of a thin, regrown protective layer 44 appears, it will be at a place that will not harm the device. For example, none of that portion of the protective layer 49 overlying the groove at the side 48 of the pocket has to be cut away or regrown, so that the protective qualities of the original layer 49 at the side 48 are retained. Metal contacts, such as contact 18, are on top of the regrown protective layer 44 only at places that overlie the semiconductor material 47 of the pocket itself, so that if a short occurs, it will only be between the contact 18 and the semiconductor material 47 in the pocket, which is not a defect. Similarly, if a miscalculation is made during the lapping step which causes a portion of the insulating layer 42 in the groove to be too thin (as shown in FIG. 3), the original protective layer 49 overlying the groove prevents any possible shorts from occurring between an overlying metal contact 18 and the underlying support layer 13.

Referring to FIG. 5, an improved process for manufacturing the invented composite semiconductor device having a plurality of dielectrically isolated pockets is shown. For a description of a typical prior art manufacturing process, reference should be made to the aforementioned Proceedings of the Fourth Annual Microelectronics Symposium. The initial step comprises selecting a semiconductor wafer 50, which typically may be silicon containing a P-type or N-type dopant. As an example, wafer 50 is shown as doped with an N-type impurity. It should be mentioned that at this step, an N+ layer (P+ if wafer is P-type impurity) is sometimes formed on one surface of the wafer, using either a diffusion or an epitaxy type process. For the sake of simplicity in the following description, however, formation of the N+ layer is shown in the step relating to FIG. 5*e*, although the layer could be formed during an earlier step without substantially changing the process.

A layer of masking material 52, such as a silicon oxide or any other suitable material that will not be affected by the chemical etchants used on the semiconductor material, is placed over the wafer surface 51, as shown in FIG. *5b*. Preferably, the masking layer 52 is a grown layer of a silicon oxide which may, for example, be formed by a well-known technique of placing wafer 50 in an oxidizing atmosphere, heating it to about 1100° C., and allowing the layer 52 of silicon oxide to grow over the surface 51. The masking material 52 thus formed may be used to control etching of the semiconductor material 50 during subsequent processing steps.

Portions of the masking material 52 are selectively removed by well-known photoengraving techniques to expose portions 54 and 55 of the surface 51 having different widths, as shown in FIG. *5c*. For example, portion 54, from which the isolation groove is to be formed, may be approximately 12 microns wide; on the other hand, portion 55, from which the contact groove is to be formed, may be approximately 10 microns wide. Next, a selective etchant, such as described in Transistor Technology, volume II by F. J. Bondy, page 598, is applied to the semiconductor material 50 exposed through the openings 54 to selectively mesa etch the selected surface and thus form discrete areas of semiconductor material surrounded by an isolation groove 56, as shown in FIG. *5d*. The etchant is permitted to dissolve a portion of the underlying semiconductor material 50 up to a depth of approximately 12 microns. In addition, and preferably simultaneously, the etchant is applied through opening 55 to selectively etch a contact groove 57 within at least one discrete area of the semiconductor material enclosed by the isolation groove 56. In this respect, it is noted that any class of etchants which are rich in nitric acid are selective, the one used being formed of 5 parts concentrated nitric acid and 1 part concentrated hydrofluoric acid. Thus, by selective etching, it is contemplated that the etchant operates relatively rapidly on silicon or other semiconductor material and yet relatively slowly on the silicon oxide or other protective material. It will be appreciated that control of the etching of the moat or channel through the wafer is thereby materially simplified. Because the width of the exposed surface 55 is less than the width of the exposed surface 54, the resulting contact groove 57 is shallower than the isolation groove 56 by about 2 microns. When the grooves 56 and 57 have been etched to the desired depth the wafer is removed from the etching solution and the masking material 52 is stripped from the surface 51. Next, a highly conductive layer 58 is formed along at least the plane surface of each mesa formed by the etching as shown in FIG. *5e*, and should also be formed at least along the interior surface of the contact groove 57. Although the layer 58 may be formed by depositing a suitable metal, preferably it is formed by diffusing a dopant of the same conductivity type as the semiconductor material 50 into the exposed surface 51, creating a layer 58 whose impurity concentration is substantially higher than the impurity concentration of the semiconductor material 50. The layer 58 may also be formed by well-known crystal growth techniques such as are commonly employed in the semiconductor art and with which the thickness of layer 58 may be precisely controlled. Examples of good N-type impurities include arsenic, antimony, and phosphorus. Because the diffused layer 58 has a higher impurity concentration, it consequently has a higher conductivity than the semiconductor wafer 50. The combination of the N-type material in wafer 50 and N+ type material in highly conductive layer 58 facilitates the formation of transistors in the final integrated circuit. These transistors have relatively low saturation resistances and relatively high breakdown voltages.

Next, the isolation groove 56 is filled with an insulating material 60 as shown in FIG. *5f*. The insulating material 60 is preferably deposited or grown over the exposed interior surface of the isolation groove 56 and the contact groove 57, as well as over the exposed plane surface 51. In the case of silicon semiconductor material, the insulating material 60 may be formed by a combination of thermal oxidation and pyrolitic deposition such as described in U.S. Patent 3,158,505, issued to J. E. Sandor on Nov. 24, 1964 and assigned to the same assignee as this invention.

A support layer 62 is then formed over the insulating material 60. Typically, this support layer 62 is a polycrystalline semiconductor material formed by an epitaxial-type growth, resulting in a polycrystalline structure. The support layer 62 protects the semiconductor material from environmental contaminants and eases the handling requirements is such are necessary for further processing.

Next, the dielectrically isolated pocket is completed by removing a portion of the top layer of semiconductor material 50 at least up to the depth of the isolation groove 56, as shown in FIG. *5g*. Preferably, the material 50 may be removed by first stripping the oxide layer 52 and applying an appropriate etchant. Following removal of a portion of the semiconductor material 50, a substantially planar protective layer 64 is formed over what is now the upper surface of the pocket of semiconductor material 66. Note that the insulating material 60 surrounds a substantial portion of the discrete area of semiconductor material 66 while the protective material 64, which may also be an insulating material, surrounds the remaining portion of the semiconductor region 66. Thus, the separated semiconductor region 66 is completely encapsulated by insulating and dielectric material. In addition to insulating the separated region 66, the overlying protective layer 64 protects what is now pocket upper surface 67 from environmental contamination. The overlying protective material 64, in the case of silicon oxide, also functions as a masking material during the forming of the discrete components in the semiconductor region 66 in accordance with well-known planar techniques, such as described in U.S. Patent 3,025,589, issued to J. A. Hoerni on Mar. 20, 1962 and assigned to the same assignee as this invention. Further, transistors, MOS devices, diodes, and other elements may be diffused into the separated region 66 as is well-known in the art.

Contact can be made to the highly conductive underlayer 58 by diffusing a highly conductive contact region 70 from the pocket upper surface 67. Preferably the highly conductive contact region 70 is formed with an impurity concentration that is substantially greater than the impurity concentration of the semiconductor material 66. Note that it is possible for the elevated portion of the highly conductive underlayer 58 to touch the upper surface 67 of the pocket without departing from the scope of the invention.

Referring to FIG. 4, a double-diffused transistor may be formed by diffusing a region 80 of opposite conductivity type, say P-type material, into the semiconductor pocket 47. The region 80 is spaced from the highly conductive underlayer 41 and the highly conductive contact region 45 and forms with the semiconductor material 47 a P-N junction 82 having an edge at the pocket upper surface 46. In addition, a separated region 84 of the one conductivity type, say N-type material, may be diffused into the opposite conductivity type region 80, forming a second P-N junction 86 which also has an edge at the pocket upper surface 46. Preferably, diffusion of the separated region 84 and the highly conductive contact region 45 are performed simultaneously, with the depth of the separated region 84 being of approximately the same depth as the contact region 45. A contact 90 may be then made through the overlying protective material 49 to region 80, another contact 92 may be made to region 84, and a third contact 18 may be made to the highly conductive contact region 45, forming a double diffused planar transistor.

While the above detailed description has shown the fundamental novel features of the invention as applied to a preferred embodiment, it will be understood that various omissions and substitutions and changes in the forms and details of the specific embodiments illustrated may be made by those skilled in the art without departing from the spirit and scope of the invention. It is the intention therefore, that the scope be limited only as indicated by the following claims.

What is claimed is:

1. In a composite semiconductor device having a plurality of pockets of semiconductor material dielectrically isolated from each other by a layer of insulating material underlying the bottom and sides thereof, each of said pockets comprising a layer of monocrystalline semiconductor material of a first conductivity type and a highly conductive underlayer extending along at least a portion of the bottom of said pocket, wherein the improvement comprises:

a raised area formed in the bottom of at least one of said pockets and adjacent to but separated from a side thereof, said raised area including a portion of said layer of insulating material and said highly conductive underlayer; and, a highly conductive contact region formed within said semiconductor layer of said pocket and extending from the upper surface thereof to the portion of said highly conductive underlayer located within said raised area, and making ohmic contact therewith.

2. The device recited in claim 1 wherein said highly conductive contact region comprises a semiconductor material of said first conductivity type having a susbtantially higher impurity concentration than the material of said semiconductor layer, and ohmic contact is made to said highly conductive contact region in said pocket at the upper surface thereof.

3. The device recited in claim 2 wherein said highly conductive underlayer comprises a semiconductor material of said first conductivity type having a substantially higher impurity concentration than the material of said semiconductor layer.

4. The device recited in claim 2 including a region of opposite conductivity type located within said semiconductor layer of at least one of said pockets, said opposite conductivity type region being spaced from said highly conductive underlayer and said highly conductive contact region and forming with said semiconductor layer a P-N junction having an edge at the upper surface of said pocket.

5. The device recited in claim 4 including a separated region of said first conductivity type located within said opposite conductivity type region and forming a second P-N junction therewith, said second junction having an edge at said upper surface of said pocket, and means for making ohmic contact to said separated region at the upper surface of said pocket, whereby said semiconductor layer comprises the collector region of a double diffused planar transistor.

6. The device recited in claim 1 including a substantially planar protective layer overlying the upper surface of said pocket, said protective layer having openings formed therein so that ohmic contact may be made to said regions within said pocket at the upper surface thereof.

References Cited

UNITED STATES PATENTS

| | | | |
|---|---|---|---|
| 3,381,182 | 4/1968 | Thornton | 317—234 |
| 3,412,295 | 11/1968 | Grebene | 317—234 |

JOHN W. HUCKERT, Primary Examiner

M. H. EDLOW, Assistant Examiner

U.S. Cl. X.R.

29—578, 590